United States Patent
Chaudhary

(12) 
(10) Patent No.: US 7,146,590 B1
(45) Date of Patent: Dec. 5, 2006

(54) CONGESTION ESTIMATION FOR PROGRAMMABLE LOGIC DEVICES

(75) Inventor: Kamal Chaudhary, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 306 days.

(21) Appl. No.: 10/927,734

(22) Filed: Aug. 27, 2004

(51) Int. Cl.
*G06F 17/50* (2006.01)

(52) U.S. Cl. ................... 716/5; 716/4; 716/6

(58) Field of Classification Search ............ 716/5, 716/4, 6
See application file for complete search history.

(56) References Cited

U.S. PATENT DOCUMENTS 7,086,023 B1 * 8/2006 Visweswariah ............ 716/6

2004/0243964 A1 * 12/2004 McElvain et al. ............ 716/12

\* cited by examiner

*Primary Examiner*—Sun James Lin
(74) *Attorney, Agent, or Firm*—Pablo Meles; Kim Kanzaki

(57) ABSTRACT

A method of estimating congestion for a programmable logic device can include calculating a number of fan-in paths for each resource in the programmable logic device and calculating a number of fan-out paths for each resource in the programmable logic device. For each resource of the programmable logic device, a number of paths having different path characteristics can be determined and a probability can be assigned thereto. One or more measures of congestion can be computed according to the determining step.

25 Claims, 2 Drawing Sheets

CONGESTION ESTIMATION FOR PROGRAMMABLE LOGIC DEVICES

BACKGROUND

1. Field of the Invention

This invention relates to the field of programmable logic devices and, more particularly, to estimating congestion in programmable logic devices.

2. Description of the Related Art

Programmable logic devices (PLD's), such as field programmable gate arrays (FPGA's), have become increasingly complex and heterogeneous. As such, these devices can include a number of different components that must be interconnected using a variety of different routing resources. Within FPGA's, however, routing resources are finite. As such, competition among components for wiring resources, referred to as congestion, can dictate many aspects of a design for a PLD such as area usage and timing performance.

A user design for a PLD typically is represented as a netlist or other construct specifying logical functions and connections between those functions. A synthesis tool interprets the netlist to create logic blocks and connectivity between the logic blocks. During placement, the logic blocks are assigned to physical locations on the PLD, thereby creating a plurality of sources and loads. Further, the user specified connections between logical functions, now logic blocks, must be routed. Routing user specified connections between logic blocks usually requires a plurality of different wiring resources to complete the connection. This can result in increased competition for selected wiring resources, particularly as regions of the PLD become more populated than others and as user specified timing constraints are taken into consideration.

Accordingly, congestion in a PLD design can manifest itself in several different ways. One way is that as designs become larger, the design may become unroutable. In other cases, the routing may adversely affect the timing characteristics of the PLD design. Still, before congestion can be alleviated or avoided, congestion must be accurately predicted or estimated.

One technique for predicting congestion is to perform a fast estimation of the congestion based upon design placement. Solutions based upon this premise have been proposed for application specific integrated circuits (ASIC's). For example, one approach for estimating congestion within ASIC's has been to use a probabilistic model. The model relies upon two assumptions, particularly that wire used for routing is exactly as long as required and that any two wires crossing can be connected by a via.

Unfortunately, these assumptions do not hold true in the case of FPGA's. FPGA's have wires of fixed, pre-determined length. Further, the connectivity among the wires is limited and fixed. Accordingly, it would be beneficial to provide a technique for estimating congestion in PLD's, and particularly, FPGA devices. It would further be beneficial to provide a model or technique that accounts for specific features of such devices.

SUMMARY OF THE INVENTION

The present invention provides a method, system, and apparatus for estimating congestion within programmable logic devices (PLD's) and, more particularly, within field programmable gate array's (FPGA's). In one embodiment, the present invention provides a probabilistic model for estimating congestion within such devices. In another embodiment, the present invention provides a solution for estimating congestion that takes into account the fixed wire lengths and connection restrictions inherent to PLD's.

One embodiment of the present invention can include a method of estimating congestion for a PLD. The method can include calculating a number of fan-in paths for each resource in the PLD and calculating a number of fan-out paths for each resource in the PLD. For each resource of the PLD, a number of paths having different path characteristics, such as a number of programmable interconnect points or path delays, can be determined and a probability can be assigned thereto. At least one measure of congestion can be computed according to the determining step.

Other embodiments of the present invention can include a machine readable storage that has been programmed to cause a machine to perform the steps disclosed herein as well as a system for performing the various steps disclosed herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
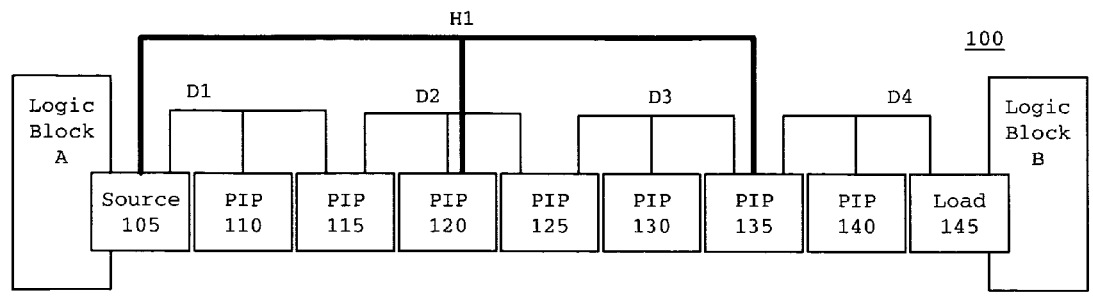
FIG. 1 is a schematic diagram illustrating a portion of a programmable logic device (PLD).

FIG. 1 is a schematic diagram illustrating a portion of a programmable logic device (PLD) 100. As shown, the PLD 100, or portion thereof, can include a source node 105 and a load node 145. In one embodiment, the source node 105 is an output pin or connector for a logic block A. The load node 145 is an input pin or connector to logic block B. As specified by a user design for PLD 100, logic block A is connected to logic block B. As shown, the user specified connection between the two logic blocks requires one or more wiring resources.

Between the source and load nodes are 7 switches or programmable interconnect points (PIP's) 110, 115, 120, 125, 130, 135, and 140. The PIP's can be used to create connections between wires in the PLD 100 to form a path between the source 105 and the load 145.

As shown, a path can be created between the source 105 and load 145 using 4 double wires, or wires having a length of two tiles, in this case wires D1, D2, D3, and D4. Similarly, a hex wire H1 having a length of 6 tiles can be used in combination with double wire D4 to form the path.

Those skilled in the art will recognize that the source-load connection depicted in FIG. 1 is but an example of the many source-load connections that can be found within a PLD. The connections within a PLD can vary according to user specified constraints, available resources, and the methods used to place and route the design.

Figure 2:
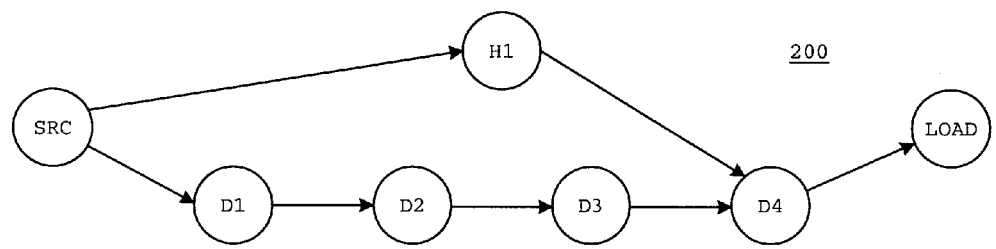
FIG. 2 is a directed routing graph representation of the portion of the PLD illustrated in FIG. 1 upon which congestion estimation can be performed in accordance with one embodiment of the present invention.

FIG. 2 is a directed routing graph 200 representation of the portion of the PLD illustrated in FIG. 1 upon which congestion estimation can be performed in accordance with one embodiment of the present invention. The directed routing graph 200 can be generated by a router, which is a computer program executing within a suitable information processing system or other computer system. The router can route signals between sources and nodes in the PLD. More particularly, the router can select which wires will be used to link the various components of the PLD.

In any event, a router can abstract characteristics of the PLD 100 of FIG. 1 to generate the directed routing graph 200 of FIG. 2. The directed routing graph 200 includes both nodes and arcs. Each wire resource of the PLD is represented as a node and each PIP connecting two wires is represented as an arc between two corresponding nodes.

The directed routing graph 200 illustrates two possible routings between the source and load. The first routing is source-H1-D4-load. The second is source-D1-D2-D3-D4-load. In one mode of operation, the router can be configured to minimize the number of PIP's and wires used to make a connection, i.e. a user specified connection between a source and load. In that case, the router would favor the first routing over the second. Following the same mode of operation, if other connections are to be made, competition may exist for the H1 wire, for example, thereby contributing to congestion.

Figure 3:
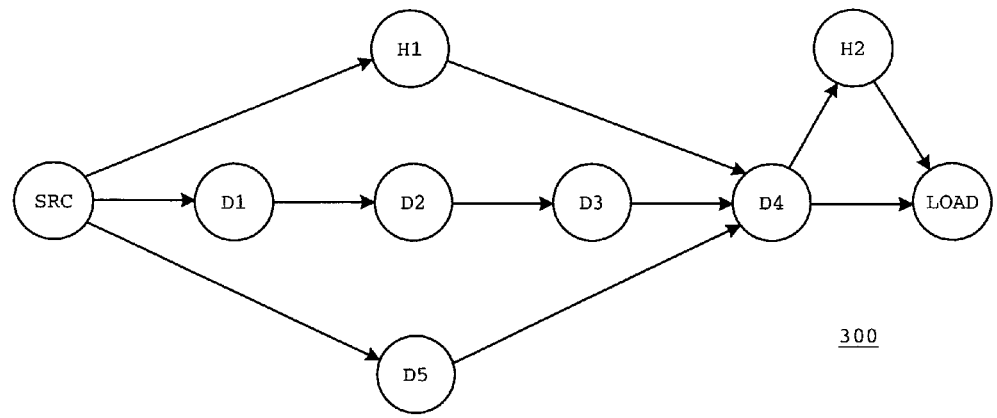
FIG. 3 is another directed routing graph for which congestion estimation can be performed in accordance with another embodiment of the present invention.

FIG. 3 is another directed routing graph 300 for which congestion estimation can be performed in accordance with another embodiment of the present invention. In general, once the directed routing graph 300 is generated, the router can process the graph 300 to determine one or more estimates of congestion for the circuit design. The router can calculate a number of fan-in paths and fan-out paths for each node representing a wiring resource in the PLD represented by the directed routing graph 300. The router then can determine a number of paths having a different propagation delay or a different number of PIP's and assign a probability to each such path. Finally, one or more measures of congestion can be computed.

Figure 4:
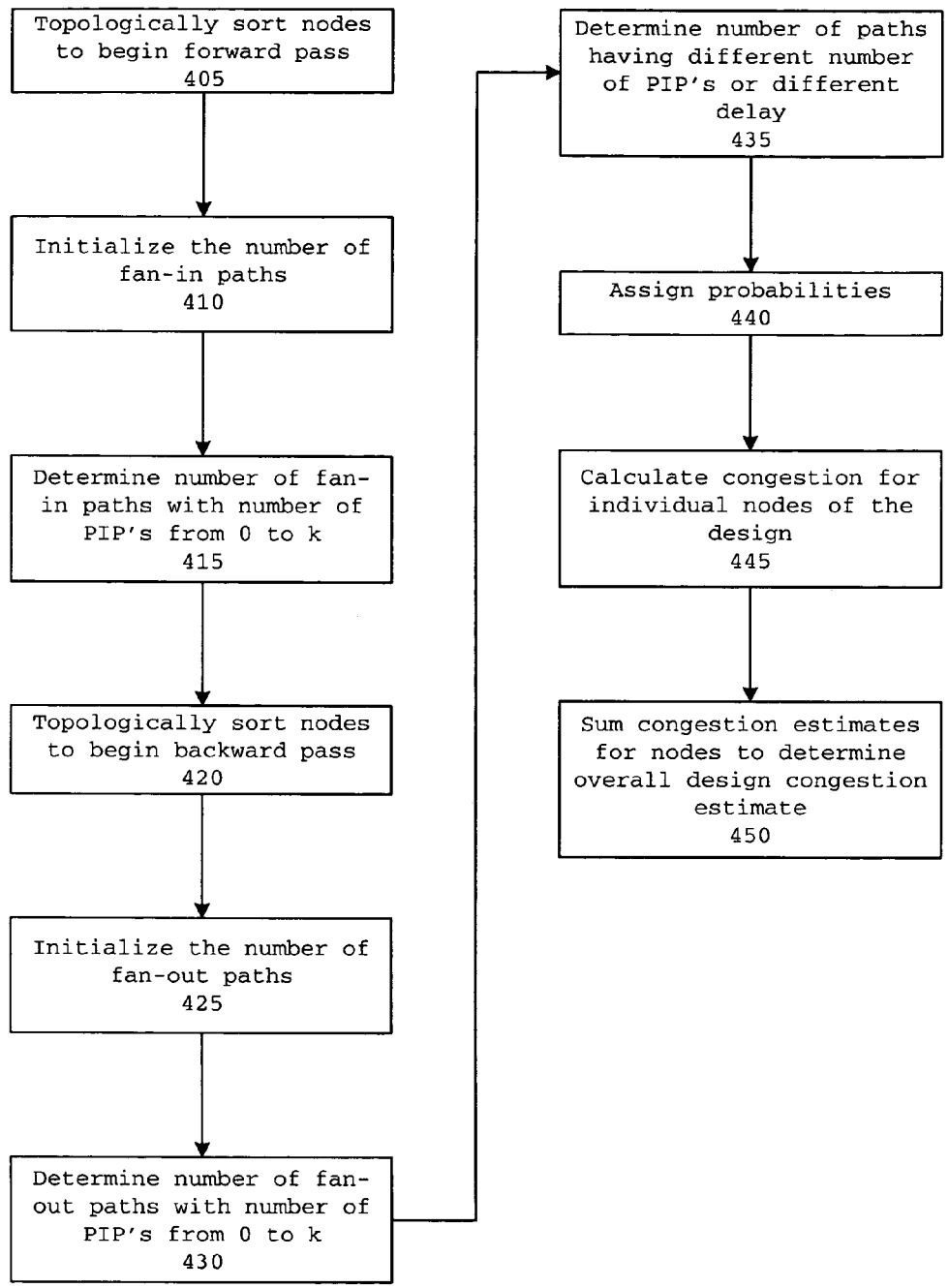
FIG. 4 is a flow chart illustrating a method of estimating congestion in accordance with yet another embodiment of the present invention.

FIG. 4 is a flow chart illustrating a method 400 of estimating congestion in accordance with yet another embodiment of the present invention. The method 400 can begin in a state where a router has generated a directed routing graph, such as that of FIG. 3, for a PLD circuit design.

In step 405, the nodes, representing wiring resources, of the directed routing graph can be topologically sorted to perform a forward pass through the nodes. The nodes can be sorted from the source of a user specified connection to a load of the user specified connection in a manner that reflects the signal flow through the graph nodes. Thus, referring to FIG. 3, the nodes can be sorted as follows: source, D1, H1, D2, D5, D3, D4, H2, and load.

In step 410, a variable representing the number of fan-in paths for each node can be initialized. In one embodiment, #faninpaths$_c$(i,k) can represent the number of fan-in paths at node i with k PIP's from the source of a user specified connection. The subscript "c" has been used to indicate instances where a variable pertains to a user specified connection. Accordingly, #faninpaths$_c$(i,k) can be initialized to 1, where i is initially equal to the source node and k is set equal to 0.

In step 415, the number of fan-in paths with the number of PIP's from 0 to k can be determined for a connection. In one embodiment, #faninpaths$_c$(i,k) can be determined according to the following relationship:

$$\#faninpaths_c(i, k) = \sum_{j \in fanin\ of\ i} \#faninpaths_c(j, k-1).$$

Taking the directed routing graph of FIG. 3, the node H1 has a single fan-in path with a single arc leading to it. As such, H1 has a single fan-in path with 1 PIP. Table 1 below illustrates values for fan-in paths for each node according to the number of PIP's as determined using the above formula in reference to FIG. 3. As can be seen from a review of the table below, the source node has 1 fan-in path with 0 PIP's. The load has 6 fan-in paths, 1 path with a 3 PIP's, 2 paths with 4 PIP's, 2 paths with 5 PIP's, and one path with 6 PIP's.

TABLE 1

| Node | Fan-in, 0 PIP's | Fan-in, 1 PIP | Fan-in, 2 PIP's | Fan-in, 3 PIP's | Fan-in, 4 PIP's | Fan-in, 5 PIP's | Fan-in, 6 PIP's |
|---|---|---|---|---|---|---|---|
| Source | 1 | 0 | 0 | 0 | 0 | 0 | 0 |
| D1 | 0 | 1 | 0 | 0 | 0 | 0 | 0 |
| H1 | 0 | 1 | 0 | 0 | 0 | 0 | 0 |
| D2 | 0 | 0 | 1 | 0 | 0 | 0 | 0 |
| D5 | 0 | 1 | 0 | 0 | 0 | 0 | 0 |
| D3 | 0 | 0 | 0 | 1 | 0 | 0 | 0 |
| D4 | 0 | 0 | 2 | 0 | 1 | 0 | 0 |
| H2 | 0 | 0 | 0 | 2 | 0 | 1 | 0 |
| Load | 0 | 0 | 0 | 2 | 2 | 1 | 1 |

In step 420, the nodes of the graph can be sorted topologically to begin a backward pass, that is a pass from load to source. In this case, the nodes can be sorted in the reverse order with respect to signal flow. Again referring to FIG. 3, the nodes can be sorted as follows: load, H2, D4, H1, D3, D5, D2, D1, and source.

In step 425, a variable representing the number of fan-out paths for each node can be initialized. In one embodiment, #fanoutpaths$_c$(i,k) can represent the number of fan-out paths at node i with k PIP's from the load of a connection. Accordingly, #fanoutpaths$_c$(i,k) can be initialized to 1, where i is initially equal to the load node and k is set equal to 0.

In step 430, the number of fan-out paths with the number of PIP's from 0 to k can be determined for a connection. In one embodiment, #fanoutpaths$_c$(i,k) can be determined as follows:

$$\#fanoutpaths_c(i, k) = \sum_{j \in fanin\ of\ i} \#fanoutpaths_c(j, k-1).$$

The fan-out paths for each node can be calculated in similar fashion to the fan-in paths, with the exception that the methodology works from load to source rather than source to load.

Referring again to FIG. 3, Table 2 below illustrates values for fan-out paths for each node according to the number of PIP's as determined using the above formula.

TABLE 2

| Node | Fan-out, 0 PIP's | Fan-out, 1 PIP | Fan-out, 2 PIP's | Fan-out, 3 PIP's | Fan-out, 4 PIP's | Fan-out, 5 PIP's | Fan-out, 6 PIP's |
|---|---|---|---|---|---|---|---|
| Load | 1 | 0 | 0 | 0 | 0 | 0 | 0 |
| H2 | 0 | 1 | 0 | 0 | 0 | 0 | 0 |
| D4 | 0 | 1 | 1 | 0 | 0 | 0 | 0 |
| H1 | 0 | 0 | 1 | 1 | 0 | 0 | 0 |
| D3 | 0 | 0 | 1 | 1 | 0 | 0 | 0 |
| D5 | 0 | 0 | 1 | 1 | 0 | 0 | 0 |
| D2 | 0 | 0 | 0 | 1 | 1 | 0 | 0 |
| D1 | 0 | 0 | 0 | 0 | 1 | 1 | 0 |
| Source | 0 | 0 | 0 | 2 | 2 | 1 | 1 |

In step 435, the number of paths, denoted as $\#paths_c(i,k)$, having a different number of PIP's can be determined. In other words, $\#paths_c(i,k)$ represents the number of total paths passing through node i with k PIP's from the source node to the load node of the connection. For example, the number of paths having 1 PIP, 2 PIP's, 3 PIP's, etc. can be determined. The calculation can be performed using the following relationship:

$$\#paths_c(i,k) = \sum_{j=0}^{k} \#faninpaths_c(i, k-j) \times \#fanoutpaths_c(i, j).$$

Continuing with the example of FIG. 3, the following illustrates the operation of the above relationship in the calculation of the number of paths with 1 PIP: (#fan-in paths at source with 1 PIP)*(#fan-out paths at source with 0 PIP's)+(#fan-in paths at source with 0 PIP's)*(#fan-out paths at source with 1 PIP). This equation results in a value of 0. Continuing with this example, and using the relationship described with reference to step 435, it can be determined that 0 paths have 1 PIP, 0 paths have 2 PIP's, 2 paths have 3 PIP's, 2 paths have 4 PIP's, 1 path has 5 PIP's, and 1 path has 6 PIP's.

In step 440, probabilities for paths from source to load for varying numbers of PIP's can be assigned. The values represent the probability that the router will select a path with k PIP's for a given connection. The probability of selecting a path of k PIP's can be denoted as $P_c(k \text{ PIP's})$. A probability of a net having k PIP's can be determined based upon known characteristics of the router as well as parameters such as connection criticality. A critical connection is one in which the time required for a signal to propagate through the connection is longer than that allowed by a design constraint referred to as the target delay.

While $P_c(k \text{ PIP's})$ can be determined in a variety of different ways, generally $P_c(k \text{ PIP's})$ should satisfy the following conditions: $P_c(kPIP's)=0, \text{ if } \#paths_c(srcnode,k)=0$ and $$\sum_{k=0}^{MaxPIPs} P_c(kPIP's) = 1.$$

In one embodiment, $P_c(k \text{ PIP's})$ can be determined such that only the routes with minimum PIP's are used. In that case, K can be the minimum PIP for which $\#paths_c(\text{sourcenode}, k) > 0$. In that case, PC (i) can be simplified as $P_c(i) = \#paths_c(i,K)/\# paths_c(srcnode, K)$.

Still, different path characteristics can be used to estimate congestion. In one embodiment, path delay can be used in lieu of PIP's. That is, the signal propagation delay for a given path or connection can be used. In architectures that are fully buffered, for example, the delay can be assumed to be additive. Accordingly, the path counting techniques disclosed herein can be modified to count the number of paths with different delays rather than PIP's.

In any case, using the probabilities determined in step 440, a probability $P_c(i)$ representing the likelihood that a node i (a wire) will be used within a given connection can be determined in step 445. $P_c(i)$ can be determined according to the following relationship:

$$P_c(i) = \sum_{k=0}^{MaxPIPs} P_c(kPIP's) \times \#paths_c(i,k)/\#paths_c(srcnode, k).$$

Thus, $P_c(i)$ provides a measure of congestion for each node of a design.

In step 450, the congestion estimates for each node can be summed to determine an overall congestion estimate for the design. The overall congestion estimate can be determined using the following relationship:

$$P(i) = \sum_{c \in connection} P_c(i) \forall\, i \in \text{Nodes of graph}.$$

A value of P(i)>1, indicates that changes in the placement of the design must be addressed. That is, the congestion level is such that the router cannot adequately alleviate the congestion and improvements can be achieved through changing the placement of the design.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of estimating congestion for a programmable logic device comprising the steps:
    calculating a number of fan-in paths for each routing resource in the programmable logic device;
    calculating a number of fan-out paths for each routing resource in the programmable logic device;
    for each routing resource of the programmable logic device, determining a number of paths having different path characteristics and assigning a probability thereto; and
    computing at least one measure of congestion according to said determining step.

2. The method of claim 1, said step of calculating a number of fan-in paths comprising sorting the routing resources from a source to a load in a forward pass.

3. The method of claim 2, wherein said step of calculating a number of fan-in paths is performed according to $$faninpaths_c(i, k) = \sum_{j \in fanin\ of\ i} faninpaths_c(j, k-1).$$

4. The method of claim 1, said step of calculating a number of fan-out paths comprising sorting the routing resources from a load to a source in a backward pass.

5. The method of claim 4, wherein said step of calculating a number of fan-out paths is performed according to $$fanoutpaths_c(i, k) = \sum_{j \in fanout\ of\ i} fanoutpaths_c(j, k-1).$$

6. The method of claim 1, wherein the path characteristics are selected from a group consisting of a number of programmable interconnect points and path delay.

7. The method of claim 6, wherein said step of determining a number of paths is performed according to $$\#paths_c(i, k) = \sum_{j=0}^{k} \#faninpaths_c(i, k-j) \times \#fanoutpaths_c(i, j).$$

8. The method of claim 1, said step of computing at least one measure of congestion comprising calculating the at least one measure of congestion for at least one routing resource.

9. The method of claim 8, wherein a measure of congestion is calculated for each routing resource of the programmable logic device, said method further comprising summing the measures of congestion for the routing resources to determine an overall measure of congestion for the programmable logic device.

10. A computer automated system for estimating congestion for a programmable logic device, said computer automated system comprising:
    means for calculating a number of fan-in paths for each routing resource in the programmable logic device;
    means for calculating a number of fan-out paths for each routing resource in the programmable logic device;
    means for determining a number of paths having different path characteristics and assigning a probability thereto for each routing resource of the programmable logic device; and
    means for computing at least one measure of congestion according to operation of said means for determining.

11. The computer automated system of claim 10, said means for calculating a number of fan-in paths comprising means for sorting the routing resources from a source to a load in a forward pass.

12. The computer automated system of claim 11, wherein said means for calculating a number of fan-in paths operates according to $$faninpaths_c(i, k) = \sum_{j \in fanin\ of\ i} faninpaths_c(j, k-1).$$

13. The computer automated system of claim 10, said means for calculating a number of fan-out paths comprising means for sorting the routing resources from a load to a source in a backward pass.

14. The computer automated system of claim 13, wherein said means for calculating a number of fan-out paths operates according to $$fanoutpaths_c(i, k) = \sum_{j \in fanout\ of\ i} fanoutpaths_c(j, k-1).$$

15. The computer automated system of claim 10, wherein the path characteristics are selected from a group consisting of a number of programmable interconnect points and path delay.

16. The computer automated system of claim 15, wherein said means for determining a number of paths is performed according to $$\#paths_c(i, k) = \sum_{j=0}^{k} \#faninpaths_c(i, k-j) \times \#fanoutpaths_c(i, j).$$

17. A machine readable storage, having stored thereon a computer program having a plurality of code sections executable by a machine for causing the machine to perform steps of:
    calculating a number of fan-in paths for each routing resource in a programmable logic device;
    calculating a number of fan-out paths for each routing resource in the programmable logic device;
    for each routing resource of the programmable logic device, determining a number of paths having different path characteristics and assigning a probability thereto; and
    computing at least one measure of congestion according to said determining step.

18. The machine readable storage of claim 17, said step of calculating a number of fan-in paths comprising sorting the routing resources from a source to a load in a forward pass.

19. The machine readable storage of claim 18, wherein said step of calculating a number of fan-in paths is performed according to $$faninpaths_c(i, k) = \sum_{j \in fanin\ of\ i} faninpaths_c(j, k-1).$$

20. The machine readable storage of claim 17, said step of calculating a number of fan-out paths comprising sorting the routing resources from a load to a source in a backward pass.

21. The machine readable storage of claim 20, wherein said step of calculating a number of fan-out paths is performed according to $$fanoutpaths_c(i, k) = \sum_{j \in fanout\ of\ i} fanoutpaths_c(j, k-1).$$

22. The machine readable storage of claim 17, wherein the path characteristics are selected from a group consisting of a number of programmable interconnect points and path delay.

23. The machine readable storage of claim 22, wherein said step of determining a number of paths is performed according to $$\#paths_c(i, k) = \sum_{j=0}^{k} \#faninpaths_c(i, k-j) \times \#fanoutpaths_c(i, j).$$

24. The machine readable storage of claim 17, said step of computing at least one measure of congestion comprising calculating the at least one measure of congestion for at least one routing resource.

25. The machine readable storage of claim 24, wherein a measure of congestion is calculated for each routing resource of the programmable logic device, said method further comprising summing the measures of congestion for the routing resources to determine an overall measure of congestion for the programmable logic device.

* * * * *